United States Patent
Ye et al.

(10) Patent No.: US 9,748,111 B2
(45) Date of Patent: Aug. 29, 2017

(54) METHOD OF FABRICATING SEMICONDUCTOR STRUCTURE USING PLANARIZATION PROCESS AND CLEANING PROCESS

(71) Applicant: UNITED MICROELECTRONICS CORP., Hsin-Chu (TW)

(72) Inventors: Yi-Liang Ye, Kaohsiung (TW); Kuang-Hsiu Chen, Tainan (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/012,821

(22) Filed: Feb. 1, 2016

(65) Prior Publication Data
US 2017/0221723 A1  Aug. 3, 2017

(51) Int. Cl.
| | |
|---|---|
| *H01L 21/461* | (2006.01) |
| *H01L 21/321* | (2006.01) |
| *H01L 29/66* | (2006.01) |
| *H01L 21/3205* | (2006.01) |
| *H01L 21/283* | (2006.01) |
| *H01L 21/02* | (2006.01) |
| *H01L 21/3105* | (2006.01) |

(52) U.S. Cl.
CPC ...... *H01L 21/3212* (2013.01); *H01L 21/0214* (2013.01); *H01L 21/0217* (2013.01); *H01L 21/02074* (2013.01); *H01L 21/02164* (2013.01); *H01L 21/02167* (2013.01); *H01L 21/283* (2013.01); *H01L 21/31053* (2013.01); *H01L 21/32055* (2013.01); *H01L 29/66795* (2013.01)

(58) Field of Classification Search
None
See application file for complete search history.

(56) References Cited

U.S. PATENT DOCUMENTS

| 8,367,534 | B2 | 2/2013 | Chen |
| 8,889,502 | B2 | 11/2014 | Yeh |
| 2001/0026994 | A1* | 10/2001 | Watanabe ......... H01L 21/31053 438/424 |

(Continued)

FOREIGN PATENT DOCUMENTS

CN  1546627  11/2004

OTHER PUBLICATIONS

Lee, Title of Invention: Method for Fabricating Semiconductor Device, U.S. Appl. No. 14/549,529, filed Nov. 20, 2014.

*Primary Examiner* — Cory Eskridge
(74) *Attorney, Agent, or Firm* — Winston Hsu

(57) ABSTRACT

A method for fabricating a semiconductor structure includes following steps. First, a first layer, a second layer and a third layer are sequentially formed on the substrate. The second layer is conformally disposed on the top surface of the first layer. The second layer and the first layer have different compositions, and the third layer and the second layer also have different compositions. Then, a planarizing process is performed on the third layer until portions of the second layer are exposed. Afterwards, hydrofluoric acid and aqueous oxidant are concurrently or sequentially provided to the remaining second and third layers. Finally, an etch back process is carried out to remove all the second layer and portions of the first layer.

18 Claims, 8 Drawing Sheets

(56) References Cited

U.S. PATENT DOCUMENTS

2011/0306210 A1* 12/2011 Kashkoush ....... H01L 21/02052
　　　　　　　　　　　　　　　　　　　　438/692
2012/0070972 A1*　3/2012 Chen ................ H01L 21/28123
　　　　　　　　　　　　　　　　　　　　438/584

* cited by examiner

METHOD OF FABRICATING SEMICONDUCTOR STRUCTURE USING PLANARIZATION PROCESS AND CLEANING PROCESS

BACKGROUND OF THE INVENTION

1. Field of the Invention

The present invention relates generally to the field of semiconductor fabrication, and more particularly to the method of fabricating a semiconductor structure using a chemical mechanical polishing (CMP) process and a cleaning process.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Currently, since gate height loading may induce potential risk on removal of dummy gate during replacement metal gate (RMG) stage in FinFET fabrication process, the control of gate height uniformity has been an important factor for device performance improvement. Hence, how to improve the current FinFET fabrication to resolve the aforementioned issue has become an important task in this field.

SUMMARY OF THE INVENTION

To this end, an improved method for fabricating a semiconductor structure using a chemical mechanical polishing (CMP) process and a cleaning process is disclosed in the present application.

In accordance with one embodiment of the present invention, a method for fabricating a semiconductor structure includes the following steps. First, a first layer, a second layer and a third layer are sequentially formed on the substrate. The second layer is conformally disposed on the top surface of the first layer. The second layer and the first layer have different compositions, and the third layer and the second layer also have different compositions. Then, a planarizing process is performed on the third layer until portions of the second layer are exposed. Afterwards, hydrofluoric acid and aqueous oxidant are provided concurrently or sequentially to the remaining second and third layers. Finally, an etch back process is carried out to remove the second layer and the first layer.

In accordance with still another embodiment of the present invention, a method for fabricating a semiconductor structure includes the following steps. First, a first set of stripe-shaped structures and a second set of stripe-shaped structures are formed on the substrate, and there is a space between the first and second sets of stripe-shaped structures. Then, a first layer is formed over the first and second sets of stripe-shaped structures so as to form a recess on the surface of the first layer and directly above the space between the first and second sets of stripe-shaped structures. A second layer is then conformally formed over the first layer followed by forming a third layer over the second layer. Afterwards, a planarizing process is performed on the third layer until portions of the second layer are exposed so as to produce a remaining third layer in the recess and an exposed second layer. During the planarizing process, the etch rate of the third layer is greater than that of the second layer. Afterwards, hydrofluoric acid and aqueous oxidant are provided concurrently or sequentially to the remaining second and third layers. Finally, an etch back process is carried out to remove the second layer and the first layer.

Since the hydrofluoric acid and aqueous oxidant are provided concurrently or sequentially to the remaining second and third layers after the process for planarizing the second layer, the particles, such as organic particles, generated during the planarization process can be removed effectively compared with conventional fabrication processes. Therefore, during the subsequent etch back process, no particles would remain on the surfaces of the remaining second and third layers, and the first layer with a flat top surface can be obtained when the etch back process is completed.

Other technical advantages of the present invention will be readily apparent to one skilled in the art from the following figures, descriptions, and claims. Moreover, while specific advantages have been enumerated above, various embodiments may include all, some, or none of the enumerated advantages.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the present invention and its advantage, reference is now made to the following description, taken in conjunction with accompanying drawings, in which.

DETAILED DESCRIPTION

Figure 1:
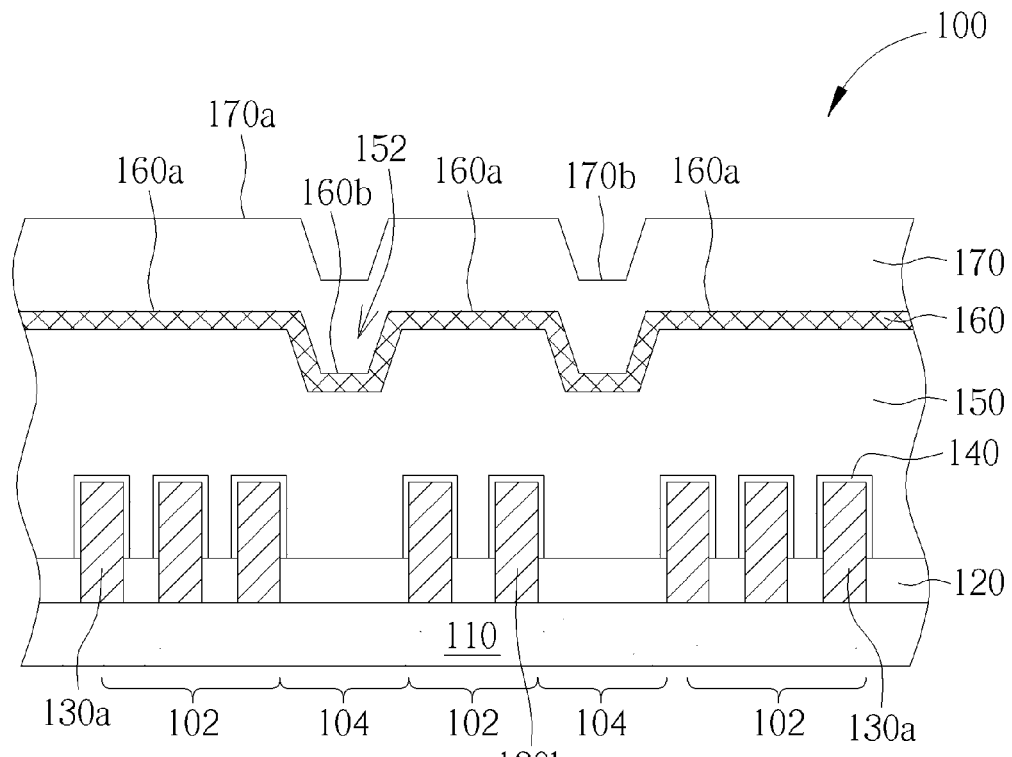
FIG. 1 illustrates an exemplary semiconductor structure with fin-shaped structure at the beginning of a fabrication process in accordance with one embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of components and regions may be exaggerated for clarity unless express so defined herein.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, the method of fabricating a semiconductor structure using a chemical mechanical polishing (CMP) process and a cleaning process is disclosed in detail.

FIG. 1 to FIG. 4 are schematic cross-sectional diagrams of an exemplary semiconductor structure with fin-shaped structure at various fabrication stages in accordance with one embodiment of the present invention. Please refer to FIG. 1 and FIG. 4. In order to obtain the structure 100 shown in FIG. 1, a semiconductor substrate 110 is first provided. Then, a first set of stripe-shaped structures 130a and a second set of stripe-shaped structures 130b may be first fabricated in a first region 102 of a semiconductor substrate 110. The first set of stripe-shaped structures 130a may be spaced apart from the second set of stripe-shaped structure 130b with a space which is defined in a second region 104 of the semiconductor substrate 110. Preferably, the space between the first and second sets of stripe-shaped structures 103a and 130b has a distance greater than spacing between two adjacent stripe-shaped structures 103a and 130b. Afterwards, an isolation structure 120, such as shallow trench isolation, may be fabricated around the lower parts of the stripe-shaped structures 130a and 130b. A thin dielectric layer 140, such as gate dielectric layer, may then be formed on the surface of the stripe-shaped structures 130a and 130b protruding from the isolation structure 120.

In one embodiment of the present invention, the stripe-shaped structures 130a and 130b may be fin-shaped structures made of semiconductor materials which can be configured to be parts of a semiconductor device, such as fin field effect transistor (FinFET), but are not limited thereto. In another embodiment, the stripe-shaped structures 130a and 130b may be parts of interconnections or contact plugs of a semiconductor device. The semiconductor substrate 110 may be chosen from a silicon substrate, III-V semiconductor substrate, silicon-on-insulator substrate, but is not limited thereto. In addition, the material of the isolation structure 120 is preferably made of silicon oxide ($SiO_2$). Alternatively, this isolation structure 120 could be made of: silicon nitride, silicon oxynitride, similar low dielectric material (preferably having a dielectric constant lower than silicon oxide) or a combination thereof.

After the formation of the stripe-shaped structures 130a and 130b, a first layer 150 is deposited over the first and second sets of stripe-shaped structures 130a and 130b. When the deposition process is completed, a recess 152 may be formed on the surface of the first layer 150 in the second region 104. In one embodiment, the first layer 150 may be made of amorphous silicon (a-Si). Alternatively, the first layer 150 could also be made of polycrystalline silicon, crystalline silicon, SiGe, metal alloy, silicide, or any material suitable for embedding fins. Preferably, the material of first layer 150 should be suitable for making a gate or a dummy gate.

Then, a second layer 160 having a composition different from that of the first layer 150 is conformally formed on the surface of the first layer 150. Since there is a recess 152 on the surface of the first layer 150, some portions of the second layer 160a outside the recess 152 may be higher than the other portions of the second layer 160b in the recess 152. In one embodiment, the second layer 160 is made of silicon nitride. Alternatively, the second layer 160 could be made of: silicon oxynitride (SiON), SiCN, SiOCN, tantalum nitride, titanium nitride, diamond-like carbon, other material properties such that it can be used as a stop layer in the subsequent planarization process or a combination thereof.

Afterwards, a third layer 170 is deposited on the second layer 160. The composition of the third layer 170 may be different from that of the second layer 160. For example, the third layer 170 may be made of silicon oxide, polycrystalline silicon, crystalline silicon, SiGe, metal alloy, silicide, or any suitable material different from the second layer 160. Then, a planarization process, such as CMP process, is carried out to remove the third layer 170 over the second layer 160 until the structure shown in FIG. 2 is obtained.

Figure 2:
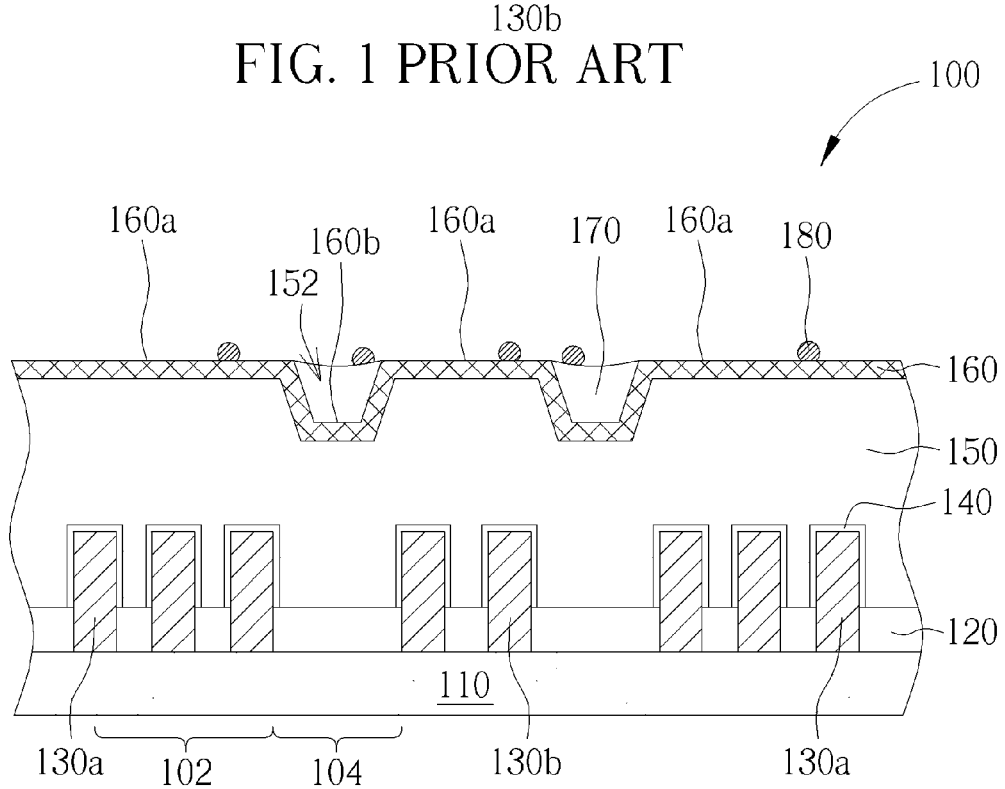
FIG. 2 illustrates an exemplary semiconductor structure with fin-shaped structure after performing a chemical mechanical polishing (CMP) process in accordance with one embodiment of the present invention.

Please refer to FIG. 2, which illustrates an exemplary semiconductor structure with fin-shaped structure after performing a chemical mechanical polishing (CMP) process in accordance with one embodiment of the present invention. When the planarization process is completed, the third layer 170 outside the recess 152 can be removed completely, and some of the third layer 170 may remain in the recess 152. It should be noted that particles 180, such as organic particles, may be generated during the planarization process, and some of them may adsorb on the second layer 160 and the third layer 170.

Figure 3:
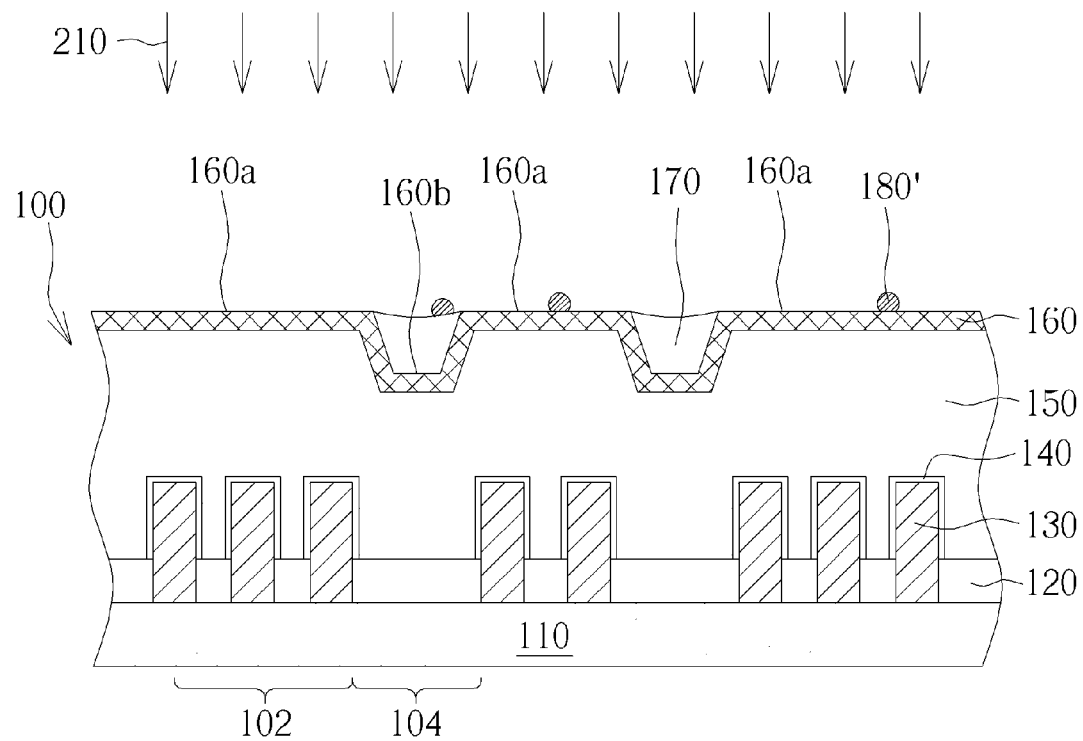
FIG. 3 illustrates an exemplary semiconductor structure with fin-shaped structure after performing a cleaning process in accordance with one embodiment of the present invention.

Please refer to FIG. 3, which illustrates an exemplary semiconductor structure with fin-shaped structure after performing a cleaning process in accordance with one embodiment of the present invention. In order to remove the particles 180, a series of cleaning processes 210 may be carried out. For example, the cleaning processes 210 may include the steps of: (i) applying a solution of sulfuric acid ($H_2SO_4$) and hydrogen peroxide ($H_2O_2$) at the temperature around 170° C., and (ii) applying a solution of deionized water, ammonium hydroxide ($NH_4OH$) and hydrogen peroxide ($H_2O_2$) (also called SC1) at room temperature. After the cleaning process, an etch back process is then carried out to define the height of the first layer 150.

Figure 4:
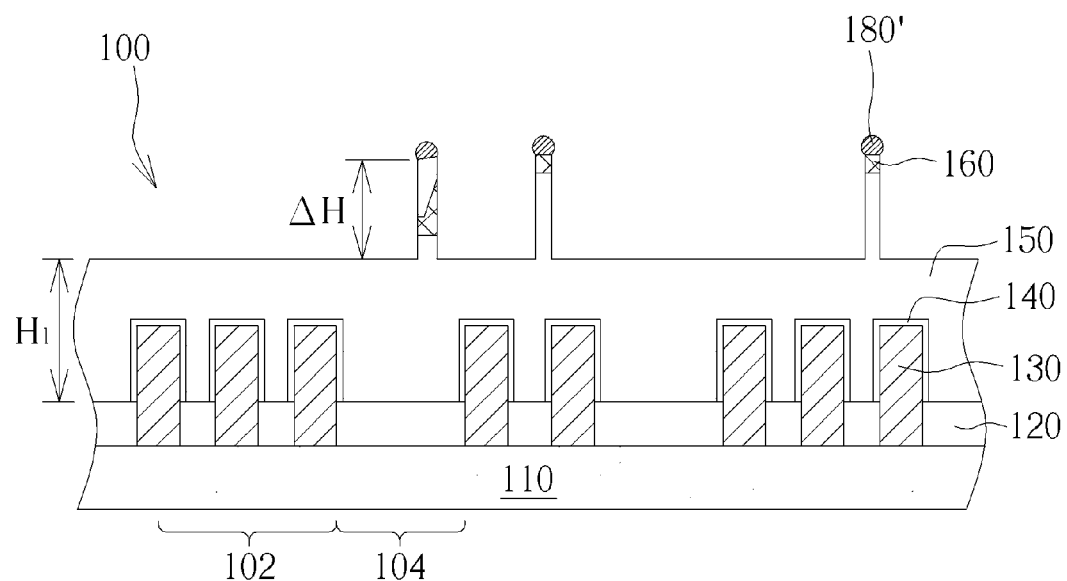
FIG. 4 illustrates an exemplary semiconductor structure with fin-shaped structure after performing an etch back process in accordance with one embodiment of the present invention.

Please refer to FIG. 4. FIG. 4 illustrates an exemplary semiconductor structure with fin-shaped structure after performing an etch back process in accordance with one embodiment of the present invention. As can be shown in the FIG. 4, since some of the particles 180 generated in the planarization process cannot be effectively removed by the cleaning process shown in FIG. 3, the remaining particles 180' may serve as an etch mask during the etch back process. As a result, there may be a height difference $\Delta H$ in the semiconductor structure 100 when the first layer 140 reaches its predetermined height H.

Figure 5:
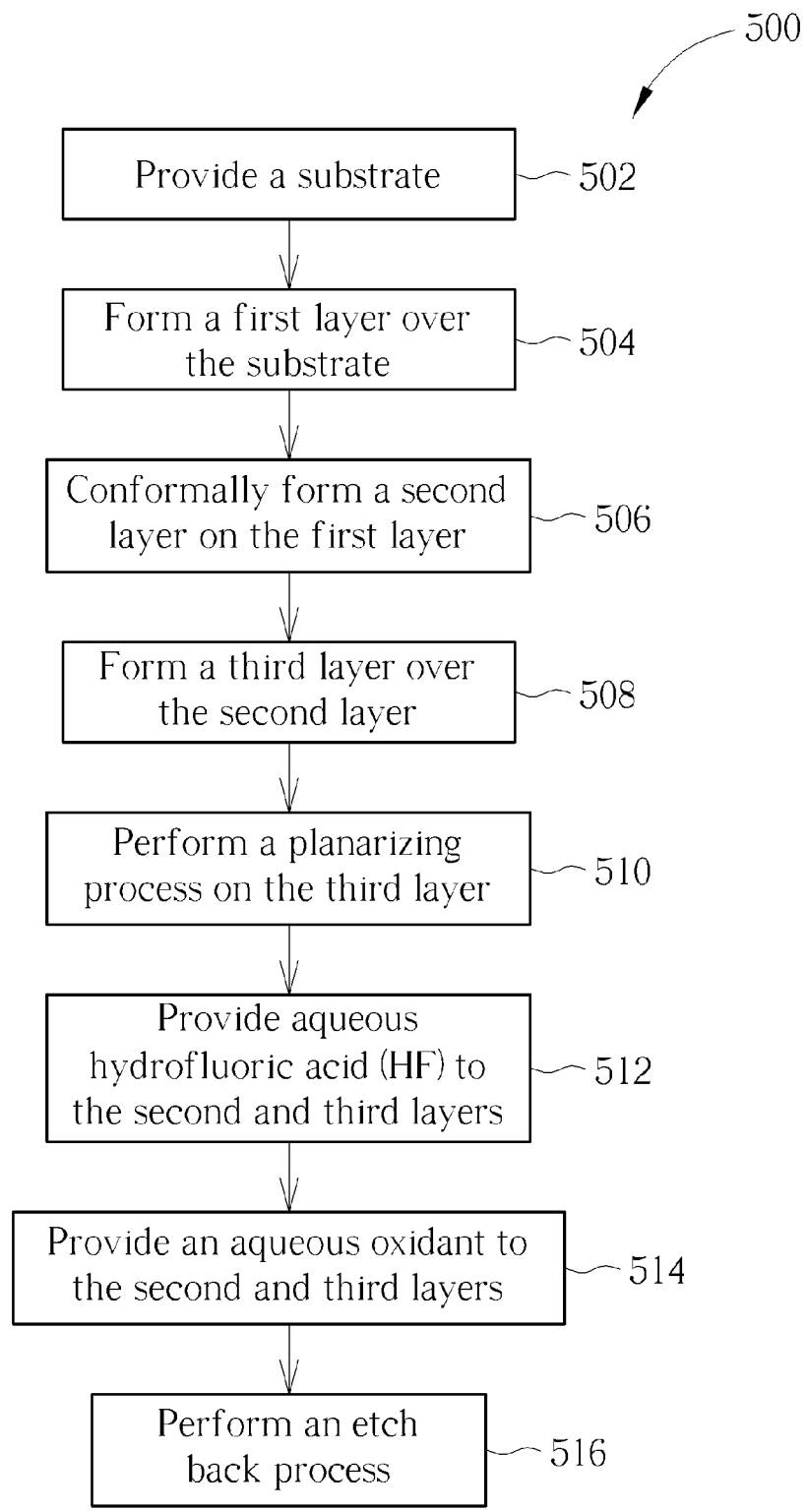
FIG. 5 depicts an exemplary flow chart for fabricating a semiconductor structure in accordance with one embodiment of the present invention.

To this end, the present invention discloses other suitable approaches in order to overcome the drawbacks of the previous embodiment. Please refer to FIG. 5, which is an exemplary flow chart for fabricating a semiconductor structure in accordance with one embodiment of the present invention. In accordance with one embodiment of a method 500 for fabricating a semiconductor structure, the method 500 includes the following steps. First, in steps 502 to 508, a first layer, a second layer and a third layer are sequentially formed on a substrate. The second layer is conformally disposed on the top surface of the first layer. The second layer and the first layer have different compositions, and the third layer and the second layer also have different compositions. Then, in step 510, a planarizing process is performed on the third layer until portions of the second layer are exposed. Afterwards, in steps 512 and 514, hydrofluoric acid and aqueous oxidant are provided concurrently or sequentially to the remaining second and third layers. Finally, an etch back process is carried out to remove the second layer and the first layer.

Figure 6:
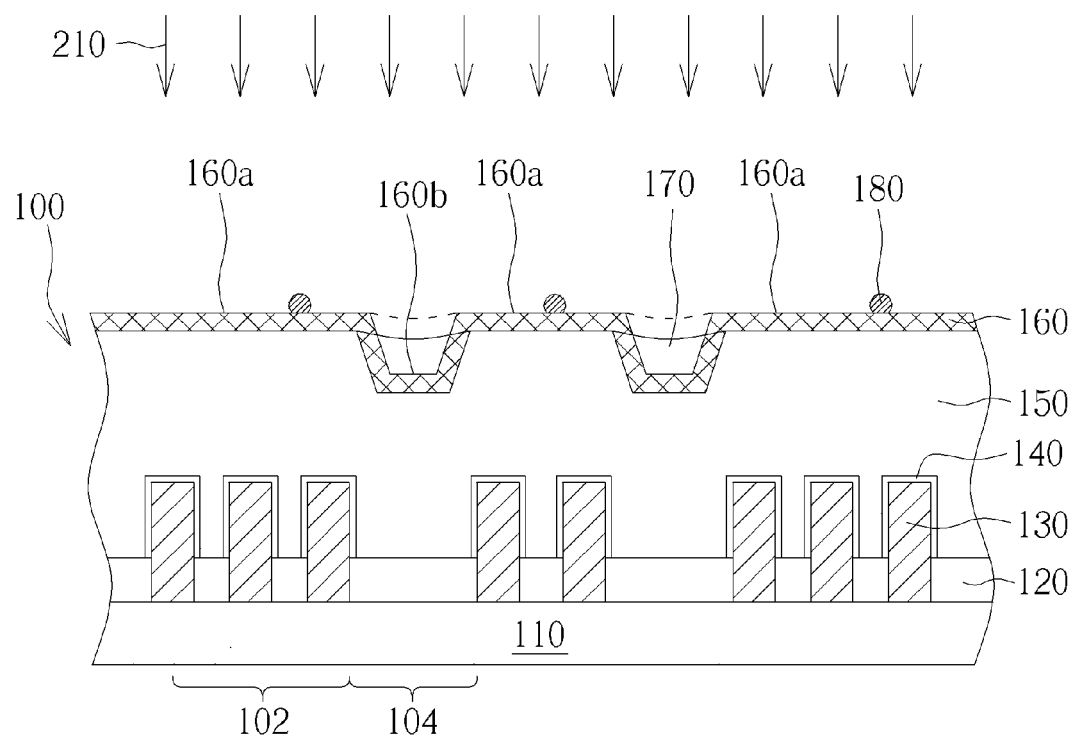
FIG. 6 illustrates an exemplary semiconductor structure with fin-shaped structure after performing a cleaning process in accordance with one embodiment of the present invention.
Figure 7:
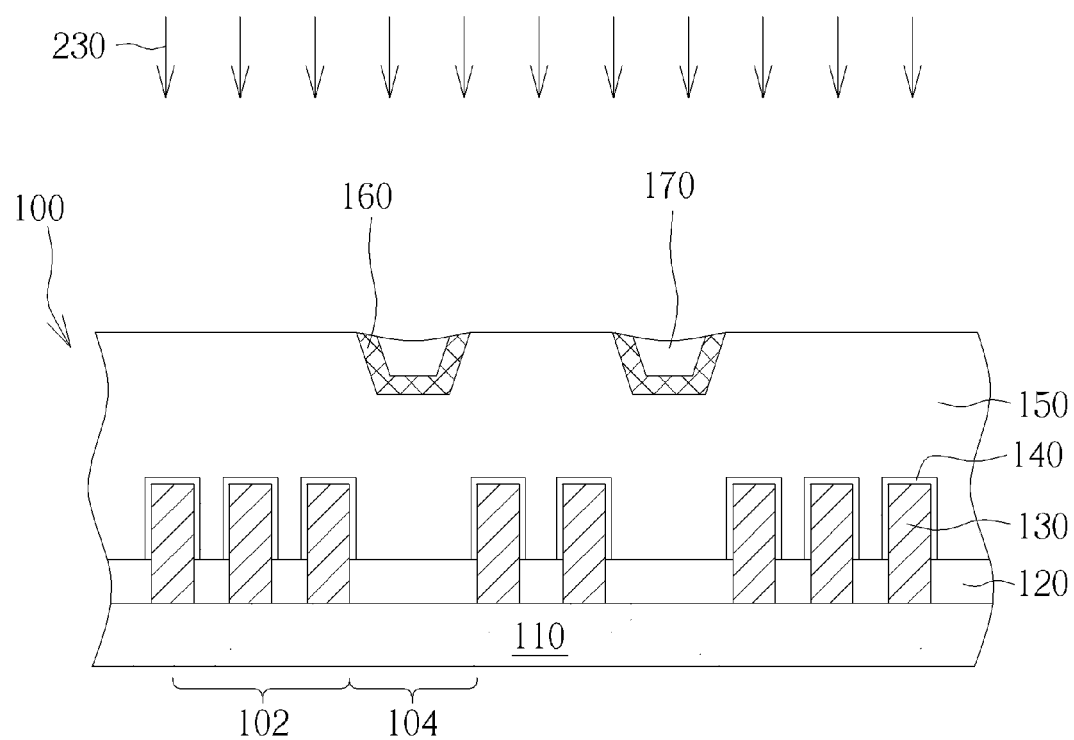
FIG. 7 illustrates an exemplary semiconductor structure with fin-shaped structure after removing an exposed layer in accordance with one embodiment of the present invention.
Figure 8:
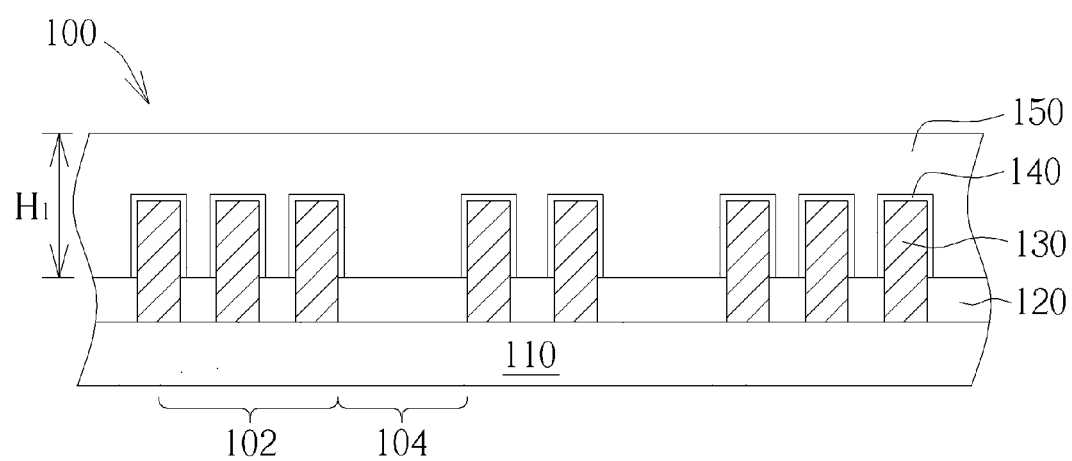
FIG. 8 illustrates an exemplary semiconductor structure with fin-shaped structure after performing an etch back process in accordance with one embodiment of the present invention.
Figure 9:
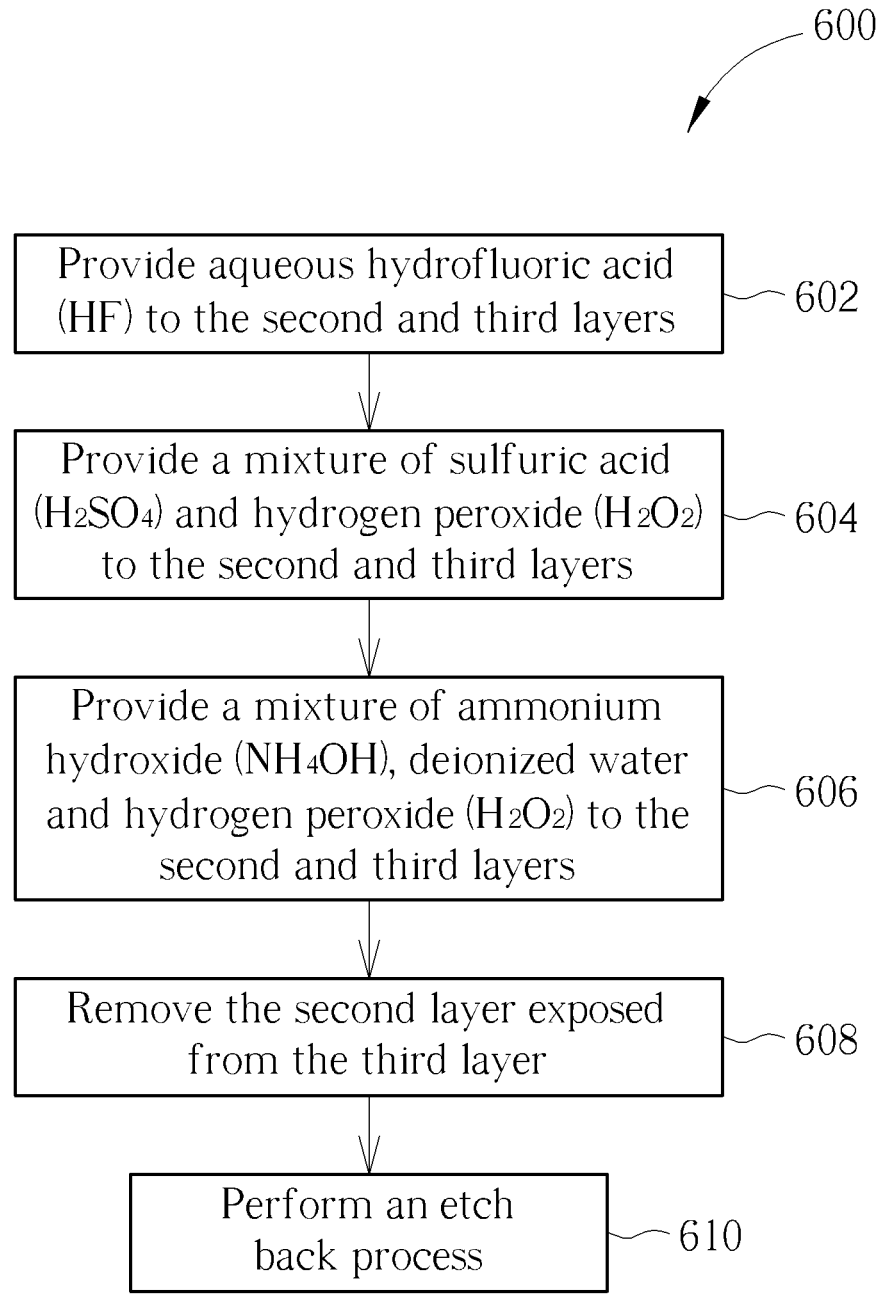
FIG. 9 depicts an exemplary flow chart for fabricating a semiconductor structure in accordance with one embodiment of the present invention.

In order to further clarify the method disclosed above, some embodiments are disclosed in the following description. FIG. 6 to FIG. 8 are schematic cross-sectional diagrams of an exemplary semiconductor structure with fin-shaped structure at various fabrication stages in accordance with one embodiment of the present invention. FIG. 9 depicts an exemplary flow chart for fabricating a semiconductor structure in accordance with one embodiment of the present invention. FIG. 8 illustrates an exemplary semiconductor structure with fin-shaped structure after performing an etch back process in accordance with one embodiment of the present invention. Please refer to FIG. 6 which shows the step following the step shown in FIG. 2. Analogously, in order to remove the particles 180 generated during the planarization process and adsorbing on the second layer 160 and the third layer 170, a series of cleaning processes may be carried out. For example, in steps 602, 604, and 606, a cleaning process 210 may include the steps of: (i) applying diluted hydrofluoric acid (HF) to the second layer 160 and the third layer 170; (ii) applying a solution of sulfuric acid ($H_2SO_4$) and hydrogen peroxide ($H_2O_2$) at the temperature of 150° C. to 180° C. to the second layer 160 and the third layer 170, and (iii) applying a solution of deionized water, ammonium hydroxide ($NH_4OH$) and hydrogen peroxide ($H_2O_2$) (also called SC1) at the temperature of 25° C. to 70° C. to the second layer 160 and the third layer 170. In a case where the second layer 160 and the third layer 170 are respectively made of silicon nitride and silicon oxide, the amount of the removed third layer 170 during the cleaning process 210 would be greater than that of the removed second layer 160. As a result, all the particles 180 directly located on the third layer 170 may be removed concurrently when the underlying third layer 170 is removed, and some of the particles 180 directly located on the second layer 170 may also be removed in steps 604 and 606.

Then in step 608, another cleaning process 230 is carried out to remove the remaining particles 180. In one embodiment, the cleaning process 230 is a wet etching process, which means the etchants applying in the wet etching process can have superior selectivity to different layers. Preferably, in a case when the second layer 160 is made of silicon nitride, the cleaning process 230 may include the step of using the solution of phosphoric acid ($H_3PO_4$) having a temperature of 150° C. to 180° C. In this way, the second layer 160 exposed from the third layer 170 can be removed completely until the underlying first layer 150 is exposed. As a result, all the particles 180 directly located on the second layer 160 may be removed concurrently when the second layer 160 underlying the particles 180 is removed. The structure following the step 608 is shown in FIG. 7

Please refer to FIG. 8. After the cleaning process, in step 610, an etch back process is then carried out to define the height of the first layer 150. Since the particles 180 are removed completely in the previous cleaning process, the first layer 150 with a flat surface and uniform height $H_1$ can be obtained when the etch back process is completed.

Figure 10:
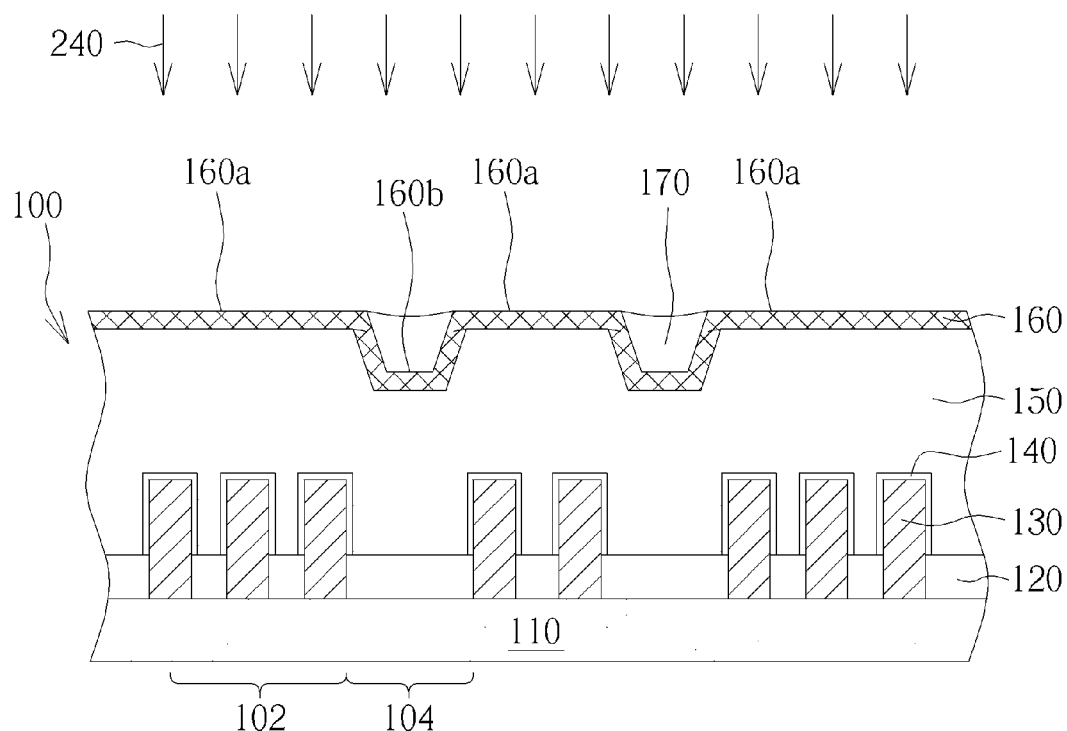
FIG. 10 illustrates an exemplary semiconductor structure with fin-shaped structure after performing a cleaning process in accordance with one embodiment of the present invention.
Figure 11:
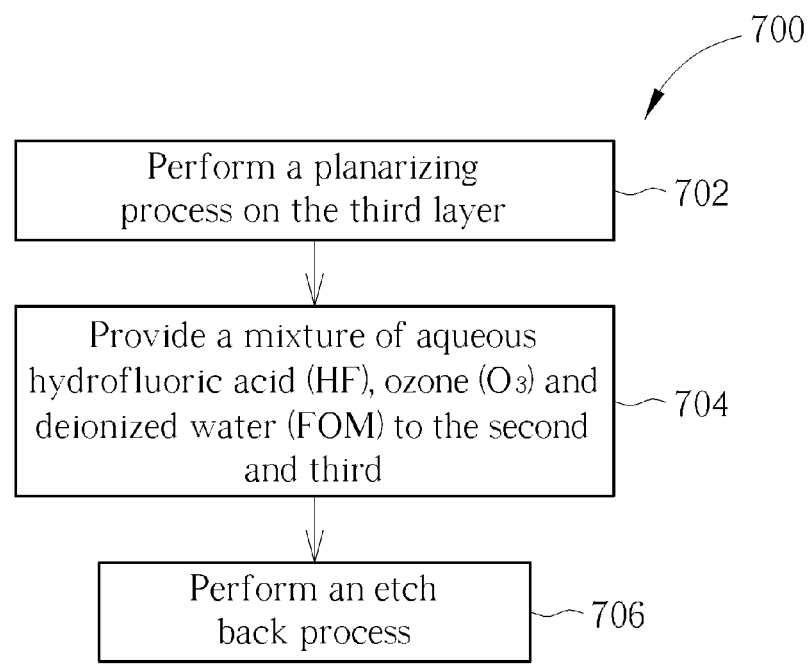
FIG. 11 depicts an exemplary flow chart for fabricating a semiconductor structure in accordance with one embodiment of the present invention.

In accordance with another embodiment of the present invention, other methods may also be used to remove the particles remaining on the second and third layers. FIG. 10 is schematic cross-sectional diagrams of an exemplary semiconductor structure with fin-shaped structure in accordance with one embodiment of the present invention. FIG. 11 depicts an exemplary flow chart of a method for fabricating a semiconductor structure in accordance with one embodiment of the present invention. In step 702, a planarization process may be performed on the structure analogous to the structure shown in FIG. 1 so as to obtain the structure analogous to that shown in FIG. 2. Please refer to FIG. 10, in order to remove the particles 180 generated during the planarization process and adsorbing on the second layer 160 and the third layer 170, a series of cleaning processes may be carried out. For example, in step 704, a cleaning process 240 is carried out, which includes the step of providing a solution of diluted hydrofluoric acid, ozone ($O_3$) and deionized water (also called FOM). Preferably, the ratio of deionized water to ozone ($O_3$) is less than 300:1. During the cleaning process 240, the particles 180 may be partially or fully oxidized by ozone to produce partially or fully oxidized particles. Then, the oxidized particles can be removed from the second layer 160 and the third layer 170 by diluted hydrofluoric acid or deionized water. After the cleaning process, in step 706, an etch back process is then carried out to define the height of the first layer 150. Analogous to the structure shown in FIG. 8, since the particles 180 are removed completely in the previous cleaning process, the first layer 150 with a flat surface and uniform height $H_1$ can be obtained when the etch back process is completed.

Figure 12:
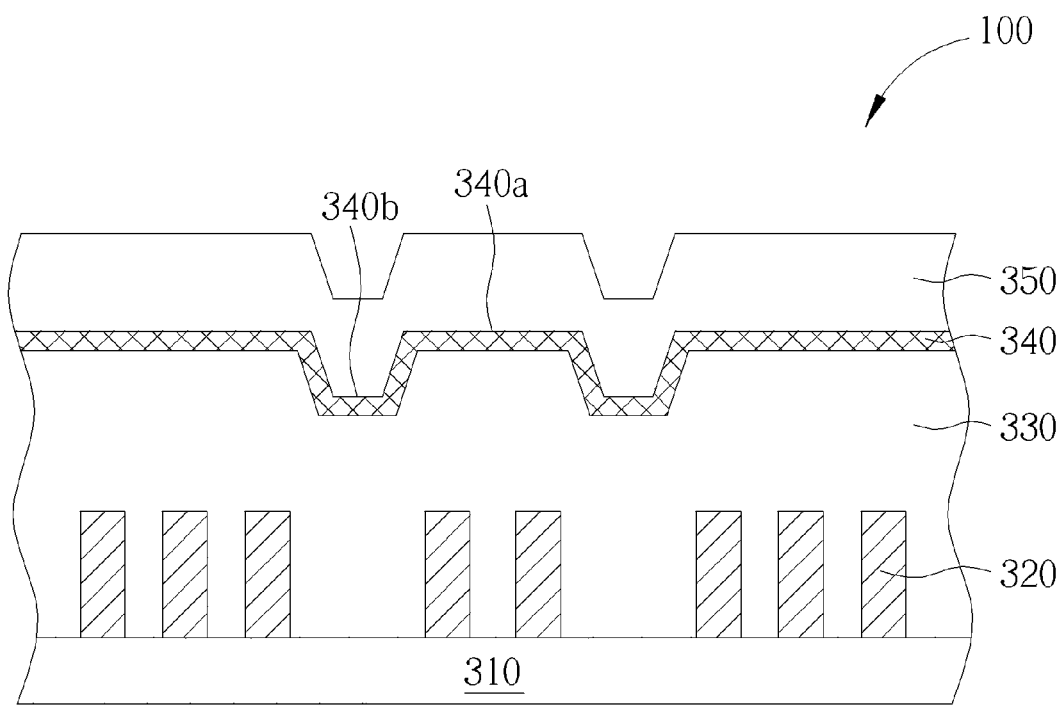
FIG. 12 illustrates an exemplary semiconductor structure with stripe-shaped structure at the beginning of a fabrication process in accordance with one embodiment of the present invention.

In the previous embodiments, the semiconductor structure have fin-shaped structure configured to be parts of semiconductor devices. In another embodiment, the semiconductor structure may have interconnections or contact plugs. Please refer to FIG. 12, which illustrates an exemplary semiconductor structure with stripe-shaped structure at the beginning of a fabrication process in accordance with one embodiment of the present invention. In this embodiment, a plurality of stripe-shaped structures 320, such as interconnections or contact plugs, are disposed on a semiconductor substrate 310. A first layer 330, a second layer 340 and a third layer similar to those of shown in FIG. 1 are sequentially deposited over the stripe-shaped structures 320. The second layer 340 also has upper portions 340a and lower portions 340b in the structure shown in FIG. 12 due to the space between two sets of the stripe-shaped structures 320. The processes following the structure shown in FIG. 12 are similar to those described above, these processes are omitted for the sake of clarity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising the steps of:
    providing a substrate;
    forming a first layer on the substrate;
    conformally forming a second layer over the first layer, wherein the second layer and the first layer have different compositions;
    forming a third layer over the second layer, wherein the third layer and the second layer have different compositions;
    performing a planarizing process on the third layer until portions of the second layer are exposed so as to produce a remaining third layer and an exposed second layer;
    performing a first cleaning process comprising a step of providing hydrofluoric acid to the remaining third layer and the exposed second layer and a step of providing an aqueous oxidant to the remaining third layer and the exposed second layer, wherein an amount of the remaining third layer removed in the first cleaning process is greater than the exposed second layer removed in the first cleaning process, wherein a top surface of the third layer is lower than a top surface of the second layer when the first cleaning process is completed;
    performing a second cleaning process to removing the exposed second layer by phosphoric acid until portions of the first layer are exposed after the first cleaning process; and
    etching back the second layer and the first layer.

2. The method of claim 1, wherein the first layer is a multilayer comprising at least a silicon layer.

3. The method of claim 1, wherein the first layer is made of polysilicon or amorphous silicon.

4. The method of claim 1, wherein the second layer is made of silicon nitride, silicon oxynitride (SiON), SiCN, SiOCN or a combination thereof.

5. The method of claim 1, wherein the third layer is made of silicon oxide.

6. The method of claim 1, wherein the step of providing the hydrofluoric acid is performed before the step of providing the aqueous oxidant, and the aqueous oxidant is an aqueous mixture of hydrogen peroxide ($H_2O2$) and sulfuric acid ($H_2SO_4$).

7. The method of claim 6, after the step of providing the aqueous oxidant, further comprising:
    providing further aqueous oxidant to the remaining third layer and the exposed second layer, wherein the further aqueous oxidant is an aqueous mixture of hydrogen peroxide ($H_2O_2$) and ammonium hydroxide ($NH_4OH$).

8. The method of claim 1, wherein the step of removing the exposed second layer comprises providing phosphoric acid ($H_3PO_4$) having a temperature of 150° C. to 180° C.

9. The method of claim 1, wherein the step of providing the hydrofluoric acid and the step of providing the aqueous oxidant are performed concurrently.

10. The method of claim 9, wherein the aqueous oxidant is an aqueous solution of ozone ($O_3$).

11. The method of claim 10, wherein the hydrofluoric acid and the aqueous solution of ozone are distributed in deionized water.

12. The method of claim 1, wherein the substrate comprises fin-shaped structures, gate structures or interconnection structures thereon.

13. A method for fabricating a semiconductor structure, comprising the steps of:
    providing a substrate;
    forming a first set of stripe-shaped structures and a second set of stripe-shaped structures on the substrate, wherein there is a space between the first and second sets of stripe-shaped structures;
    forming a first layer over the first and second sets of stripe-shaped structures so as to form a recess on the surface of the first layer, wherein the recess is directly above the space between the first and second sets of stripe-shaped structures;
    conformally forming a second layer over the first layer;
    forming a third layer over the second layer;
    performing a planarizing process on the third layer until portions of the second layer are exposed so as to produce a remaining third layer in the recess and an exposed second layer, wherein the third layer has an etch rate greater than an etch rate of the second layer in the planarizing process;

performing a first cleaning process comprising a step of providing hydrofluoric acid to the remaining third layer and the exposed second layer and a step of providing an aqueous oxidant to the remaining third layer and the exposed second layer, wherein an amount of the remaining third layer removed in the first cleaning process is greater than the exposed second layer removed in the first cleaning process, wherein a top surface of the third layer is lower than a top surface of the second layer when the first cleaning process is completed;

performing a second cleaning process to removing the exposed second layer by phosphoric acid until portions of the first layer are exposed after the first cleaning process; and etching back the second layer and the first layer.

14. The method of claim 13, wherein the first layer and the second layer have different compositions.

15. The method of claim 13, wherein the second layer and the third layer have different compositions.

16. The method of claim 13, wherein the space between the first and second sets of stripe-shaped structures has a first distance greater than spacing between two adjacent stripe-shaped structures.

17. The method of claim 13, further comprising generating a plurality of organic particles on the third layer and the second layer during the step of performing a planarizing process on the third layer.

18. The method of claim 17, wherein the particles are removed completely when the steps of providing the hydrofluoric acid and providing the aqueous oxidant are completed.

* * * * *